United States Patent [19]

Barrett et al.

[11] Patent Number: 5,825,033
[45] Date of Patent: Oct. 20, 1998

[54] SIGNAL PROCESSING METHOD FOR GAMMA-RAY SEMICONDUCTOR SENSOR

[75] Inventors: Harrison H. Barrett; Daniel G. Marks; H. Bradford Barber; Joshua D. Eskin, all of Tucson, Ariz.

[73] Assignee: The Arizona Board of Regents on Behalf of the University of Arizona, Tucson, Ariz.

[21] Appl. No.: 742,252

[22] Filed: Oct. 31, 1996

[51] Int. Cl.$^6$ ........................................................ G01T 1/24
[52] U.S. Cl. .................................... 250/370.1; 250/370.09
[58] Field of Search .......................... 250/370.1, 370.09, 250/371, 369

[56] References Cited

U.S. PATENT DOCUMENTS

| | | | |
|---|---|---|---|
| 5,107,122 | 4/1992 | Barkan et al. | 250/370.01 |
| 5,245,191 | 9/1993 | Barber et al. | 250/363.04 |
| 5,315,506 | 5/1994 | Wang et al. | 364/413.19 |
| 5,465,284 | 11/1995 | Karellas | 378/62 |

OTHER PUBLICATIONS

Barrett et al., "Charge Transport in Arrays of Semiconductor Gamma-Ray Detectors," Phys. Rev. Lett., vol. 75, No. 1, Jul. 1995, pp. 156–159.
Wang, Xiaohan and Kenneth Koral, "A Regularized Deconvolution–Fitting Method for Compton–Scatter Correction in SPECT," IEEE Trans. on Med. Imag., vol. 11, No. 3 Sep. (1992), pp. 351–360.

*Primary Examiner*—Constantine Hannaher
*Attorney, Agent, or Firm*—Antonio R. Durando

[57] ABSTRACT

A CdZnTe detector array with pixel electrodes indium-bump-bonded to a multiplexer readout circuit. The pixel size is selected so as to minimize the effect of hole trapping while ensuring that all interacting electrons deposit their energy in a designated central pixel. The readout is carried out either when a gamma-ray interaction event occurs or at time intervals likely to produce no more than one event of photon interaction at any given pixel. The readout signal for each pixel is compared to a corresponding threshold signal to identify clusters of adjacent pixels having an above-threshold signal. Then, a central pixel is designated for each cluster, the signals from a predetermined number of pixels in and/or neighboring the cluster are added to produce a cumulative signal, and the cumulative signal is assigned to the designated central pixel. The cumulative signals so produced and the positions of corresponding central pixels are then processed to generate an image of the gamma-ray emitting source. According to other embodiments of the invention, the signals from a predetermined number of pixels in and/or neighboring the clusters are used to estimate spatial coordinates and energy of each interaction event or to estimate the spatial and energy distribution of the fluence of events of gamma-ray interaction with the detector.

17 Claims, 12 Drawing Sheets

```
'GAINFIND: This program takes a set of input data for a 3x3
'array of pixels from the file "spect.dat" and finds the gains of those
'nine pixels, storing them in the file "gains.dat".

OPEN "c:\dan\spect.dat" FOR INPUT AS #1
OPEN "c:\dan\gains.dat" FOR OUTPUT AS #2
DIM dat(9, 10000), g(9), hist(200)

FOR n = 1 TO 10000
FOR i = 1 TO 9
INPUT #1, dat(i, n)
NEXT i
NEXT n
b = 700
t = 35
FOR h = 1 TO 9
g(h) = 1
NEXT h
FOR w = 1 TO 10
FOR i = 1 TO 9
FOR h = 1 TO 100
hist(h) = 0
NEXT h
FOR n = 1 to 10000
s = 0
IF dat(i, n) < b * g(i) THEN GOTO 10
FOR j = 1 TO 9
IF dat(j, n) > t * g(j) THEN s = s + dat(j, n) / g(j)
NEXT j
hst(INT(s / 10)) = hst(INT(s / 10)) + 1
10
NEXT n
v = 0
x = 0
FOR h = 1 TO 200
IF hst(h) > v THEN
v = hst(h)
x = h
END IF
NEXT h
g(i) = g(i) * 10 * x / 1400
NEXT i
NEXT w FOR j = 1 TO 9
PRINT #2, g(j)
NEXT j
CLOSE #1
CLOSE #2
```

FIG. 13

SIGNAL PROCESSING METHOD FOR GAMMA-RAY SEMICONDUCTOR SENSOR

BACKGROUND OF THE INVENTION

1. Field of the Invention

This invention is related to the general field of gamma-ray imaging. In particular, the invention provides a new method and apparatus for detecting gamma radiation emitted from an object under examination in order to construct an image corresponding to the spatial distribution of the source of radiation within the object.

2. Description of the Prior Art

There is considerable current interest in semiconductor gamma-ray detector arrays because of the improvements they may provide over scintillation cameras in a variety of applications. These devices can be used in nuclear medicine, diagnostic radiology, molecular biology, gamma-ray astronomy, particle-physics and nuclear-weapon applications. Therefore, successful development of a high-quality semiconductor array would have a substantial commercial and scientific impact.

The present application concerns a novel approach in the way data generated by detector arrays are processed in medical-imaging applications. Thus, because of the background of the invention, this disclosure is based on data and experiments related to the medical field, but its application relates to all disciplines that can utilize semiconductor sensors for gamma-ray detection.

The goal of medical imaging is to provide a spatial mapping of some parameter, feature, or process within a biological entity. Emission imaging (or nuclear medicine) comprises a class of imaging techniques that produce a functional mapping of the object under observation. Generally speaking, the techniques used in nuclear medicine involve the injection of a radioactive substance into a patient's body and the measurement of the emitted radiation (gamma rays) by radiation sensitive detectors through a system of apertures in an impermeable medium. Typically, before injection the radioactive tracer (radionuclide) is combined with a substance that is known to be preferentially concentrated in the organ of interest, so that the preferential concentration of the resulting radiopharmaceutical will correspond to an indication of blood flow, metabolism, or receptor density within the organ. Thus, an image of the resulting radioactive distribution within the organ of interest will yield functional information about the organ. Either a single projection image of the emission distribution may be taken (planar imaging) or many projection images may be acquired from different directions and used to compute the three dimensional emission distribution (single photon emission computed tomography, or SPECT).

Since photons in the energy range used in nuclear medicine are not substantially refracted or reflected, data are collected by placing attenuating apertures between the patient and the detector plane, so that each detector has an associated field of view defined by the aperture. Photons that are recorded by a particular detector element in the detector plane are known to have originated in a certain small portion of the object space. The number of photons detected by a given detector is proportional to a weighted integral of the activity contained in the region it sees. By utilizing the information collected by many detector elements or cells, each viewing different but overlapping regions of the object space, an estimate of the original activity distribution can be produced by a reconstruction algorithm according to analytical methods and techniques that are well understood by those skilled in the art.

Different kinds of apertures are commonly used to provide the desired select field of view of an object. For example, parallel-hole collimators, focused collimators, single and multiple pinhole attenuators, and several other apertures that can be used to restrict the path of the gamma rays between the radioactive object and the detector in a tomographic imaging system. In each case, each detector element ideally receives radiation from a single line from the object through the aperture of the system. U.S. Pat. No. 5,245,191 to Barber et al., hereby incorporated by reference, describes the use of a semiconductor detector array in combination with multiple-pinhole apertures to produce an improved tomographic imaging system.

Semiconductor detectors are based on the properties of semiconductor material with high atomic number that, as a result of gamma-ray absorption, produces hole-electron pairs (typically one pair for about 3 eV of energy absorbed). By applying an electric field across the semiconductor, a current results whenever gamma rays are absorbed by the semiconductor material, thus providing a means for detecting and measuring each radiation absorption event. By subdividing the area of the semiconductor surface into separate cells and by measuring the currents generated in each cell, the spatial distribution of the incident radiation can be determined. Because gamma rays incident on a semiconductor surface can be monitored electronically (rather than with traditional photomultiplier technology), a subdivision of the detector surface into smaller individual sensor cells becomes feasible, with a higher detector resolution than achievable with scintillation camera crystals. Therefore, semiconductor detectors offer a vehicle for improved performance in tomographic imaging apparatus.

A problem associated with the utilization of semiconductor detectors has been the difficulty in constructing and connecting electronics to read out the large number of sensor cells in the detector array. Another problem has been the way the signals collected by each cell are processed to generate useful and correct imaging data.

As illustrated in FIG. 1, a typical semiconductor detector 10 consist of two slabs of semiconductor material attached to each other by a process such as bump-bonding. The first slab 12, preferably made of cadmium telluride or cadmium zinc telluride for the work of the present invention, typically about 2 mm thick and 25×25 mm wide, is used to absorb the gamma rays and produce charge. The charge migrates across the detector slab under the influence of an electric field across the slab 12 produced by a negative voltage applied to a uniform metal electrode 14 on one side of the slab and produces signals on an array of output electrodes 16 (pixels) on the opposite side of the slab. Each pixel 16 is bonded to a corresponding integrated circuit fabricated on the second slab 18, which is a standard silicon wafer, by means of an indium-bump connection 20. The readout 22 can be relatively simple, merely recording the charge on each pixel, as illustrated in the enlarged partial view of FIG. 2, or it can incorporate substantial signal processing on the chip. Readouts with signal processing are called "smart" in the art.

According to one standard mode of operation, the array of pixels is scanned periodically and the signal on each pixel is read out whether or not a gamma ray has been absorbed since the last readout. Then these signals are passed off to an external computer for further processing. In another mode, a pixel is read out only when a gamma ray is absorbed in that pixel. This kind of readout is called "sparse" in the art. There is considerable interest in smart, sparse readout chips.

For each absorbed gammy ray, several pieces of information are desired. Since the arrays are used for imaging, the x and y coordinates of each gamma ray are obviously required. In current systems, these coordinates are estimated by the position of the pixel that receives the largest amount of charge in a neighborhood of charged pixels. This pixel is assumed to be the one closest to the point of gamma-ray absorption; so, it is herein referred to as the central pixel. Thus, the x-y coordinates of the central pixel are used as the estimates of the x-y coordinates of the point of gamma interaction. Since the pixels are quite small (preferably 125–400 µm), this method often provides adequate spatial resolution. However, it is still desirable to produce position estimates finer than the pixel size.

In many applications of gamma-ray detectors, it is also necessary to determine the energy E of the gamma ray. In nuclear medicine, for example, an energy estimate is used to discriminate against gamma rays that have scattered in the body, losing energy and spatial information in the process. Since the total charge produced is proportional to the gamma-ray energy, a simple estimate of the energy is the signal received by the central pixel, as revealed by a histogram (or pulse-height spectrum) of the signals received in each pixel during each sample cycle.

Unfortunately, the energy information obtained this way is not very good because of poor charge transport in the detector material. In a semiconductor, charge is transported by two kinds of charge carrier: negatively charged electrons and positively charged "holes" or vacancies in the electron distribution. The major limitation in most room-temperature semiconductor gamma-ray detectors is poor hole transport. The holes move much more slowly than electrons in a given electric field, and they are easily trapped at impurity sites or by crystal defects. Thus, hole trapping causes a severe distortion of the histogram energy estimate in many detectors because the total charge reaching the electrodes depends on the random depth of interaction.

One potential way to eliminate the effects of hole trapping on the pulse-height spectrum is to estimate the depth of interaction of the gamma ray within the slab. If the depth of interaction is known, it is possible in principle to estimate how many holes have been trapped and to make an appropriate correction to the energy estimate.

In some applications, estimation of depth of interaction is also useful for improving spatial resolution. Since the thickness of the slab 12 is usually much larger than the pixel size, and since the gamma rays can arrive obliquely at the detector surface in pinhole imaging applications, the random depth of interaction of the gamma ray in the slab and the corresponding lateral shift of its effect from the point of entry can produce a considerable blurring of the x-y information. Therefore, one way around this difficulty is to estimate the depth z of the interaction point as well as its x-y coordinates and correct the coordinates to reflect the point of entry of the gamma into the detector slab 12. Furthermore, even when the gamma rays travel perpendicularly to the surface of the detector slab, so that z is of no interest per se, it is still useful to estimate z in order to improve the estimate of the energy E.

Various methods of estimating depth of interaction have been proposed for single-element detectors, but none have been applied to pixel arrays of the kind considered here. Thus, it remains highly desirable to estimate four parameters, x, y, z and E, of each individual absorbed gamma ray. In addition, practitioners of the art wish to know the spatial and energy distribution of the overall fluence of gamma rays arriving at the detector; that is, how many gamma rays arrive per unit area (or unit volume) and per unit of energy. Theoretically, this distribution could be obtained trivially by histogramming the estimates of x, y, z and E for each gamma ray, if these estimates were perfect; but in practice severe difficulties exist due to the mentioned distortions of the energy histogram or spectrum and to non-uniformities in the x-y histogram due to variations in charge transport across the detector slab and to differences in gain and offset in the readout slab.

Therefore, another signal-processing problem that remains is the estimation of the overall fluence distribution associated with a large number of gamma rays. For the purposes of this disclosure, event estimation refers to the determination of x, y, z and E for an individual gamma ray, and fluence estimation refers to the determination of the fraction of the total fluence of gamma rays that lies in a given small range of positions or energies. The invention describes improvements in both areas.

BRIEF SUMMARY OF THE INVENTION

One objective of this invention is the development of a process and apparatus for improving the spatial resolution of semiconductor detectors for nuclear medicine applications.

Another objective of the invention is a process and apparatus that allows estimation of the depth of interaction of incident gamma rays within the detector slab.

Another goal of the invention is the estimation of the energy of the gamma rays interacting with the detector slab, such that energy estimates may be used to discriminate against gamma rays that have scattered, thereby losing energy and spatial information.

A further goal of the invention is a processing method that produces the spatial distribution of the overall fluence of gamma rays arriving at the detector.

Still another objective of the invention is a processing method that produces the energy distribution of the overall fluence of gamma rays arriving at the detector.

Finally, another goal is the implementation of the above mentioned objectives in a commercially viable system that maximizes the utilization of existing technology.

According to these and other objectives, the present invention consists of a detector array with pixel electrodes indium-bump-bonded to a multiplexer readout circuit. The pixel size is selected so as to minimize the effect of hole trapping while ensuring that the interacting electrons deposit their energy in a designated central pixel and in surrounding adjacent pixels. For CdZnTe detector slabs of the type used for the invention, the optimal pixel size was found to be about 375 µm. The readout is carried out either when a gamma-ray interaction event occurs or at time intervals likely to produce no more than one event of photon interaction at any given pixel.

According to one aspect of the invention, the readout signal for each pixel is compared to a corresponding threshold signal to identify clusters of adjacent pixels having an above-threshold signal. Then, a central pixel is designated for each cluster; for example, by selecting the pixel corresponding to the centroid of the signal spatial distribution within the cluster. The signals from a predetermined number of pixels including the central pixel are added to produce a cumulative signal, and the cumulative signal is assigned to the designated central pixel. The cumulative signals so produced and the positions of corresponding central pixels are then processed to generate an image of the gamma-ray emitting source.

According to another aspect of the invention, the readout signal for each pixel is compared to a corresponding threshold signal to identify clusters of adjacent pixels having an above-threshold signal, as in the first case. Then, the signals from a predetermined number of pixels including the cluster, intersecting the cluster or included in the cluster are used to estimate the position and energy of the interaction event that produced the signals in the cluster by means of maximum likelihood (ML) estimation. Note that the signals used may include below-threshold signals from pixels outside the cluster as well as above-threshold signals from the cluster. The procedure is based on probability distributions obtained from theoretical models with parameters fitted to data obtained from detector measurements. Maximum-likelihood estimators are so obtained for each gamma-ray interaction event. The position and energy estimates so produced are then processed to generate an image of the gamma-ray emitting source.

According to a third aspect of the invention, the readout signal for each pixel is compared to a corresponding threshold signal to identify clusters of adjacent pixels having an above-threshold signal, as in the other cases, and the signals from a predetermined number of adjacent pixels including the cluster, intersecting the cluster or included in the cluster are recorded with their corresponding position coordinates, again utilizing above-threshold as well as below-threshold signals. The procedure is repeated for each gamma-ray interaction event. Then, the signals and corresponding position information so recorded are all used at the same time to estimate the position and energy distribution of the fluence of the events of gamma-ray interaction with the detector.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

BRIEF DESCRIPTION OF THE DRAWINGS

FIG. 13 is a listing of an algorithm, written in Basic language, used to improve energy resolution by calibrating gains taking into account simultaneous signals in adjacent pixels.

DETAILED DESCRIPTION OF THE INVENTION

Figure 1:
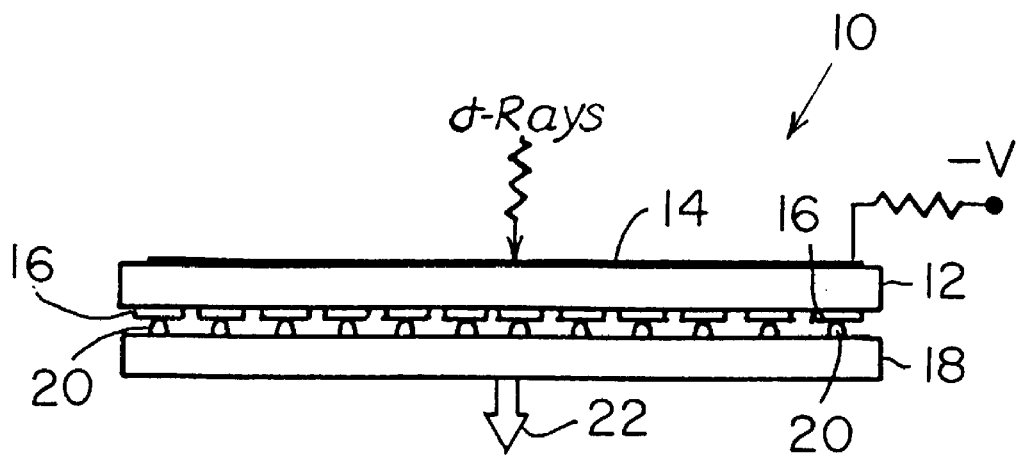
FIG. 1 is a cross-sectional schematic representation of a semiconductor detector comprising a semiconductor sensor slab connected to a multiplexer output slab through indium pump cold welds.

We recently recognized that charge carriers do not produce much signal on a small pixel until they move to within one pixel-width of the pixel under examination. This realization provided a simple and effective way of overcoming the effects of hole trapping on the energy spectrum of gamma rays detected by a semiconductor slab sensor. Basically, by making pixels small compared to the thickness of the crystal, it is possible to keep most of the holes from producing a signal simply by biasing the pixels positively. Holes then move away from the pixel, and the only holes that produce signals are the ones generated by gamma rays interacting very close to the pixel. Thus, substantial improvements in the pulse-height spectrum can be obtained simply by choosing the pixel size appropriately and using a positive bias. (See Barrett et al., "Charge Transport in Arrays of Semiconductor Gamma-Ray Detectors," Phys. Rev. Lett., Vol. 75, No. 1, pp. 156–159, July 1995.) This effect is now referred to in the art as the "small-pixel" effect.

It has also been demonstrated experimentally that there is an optimum pixel size: it should be small enough to suppress the effects of hole transport, yet large enough that a significant portion of interacting electrons deposit their energy in a cluster of affected pixels. For detector slabs of the type used for the invention, the optimal pixel size was found to be in the 125–400 $\mu$m range, the specific size depending on the thickness of the detector slab. See Eskin et al., "Variations in Pulse-Height Spectrum and Pulse Timing in CdZnTe Pixel Array Detectors," Proc. SPIE, Vol. 2859 (1996), pp.46–49; and Eskin et al., "The Effect of Pixel Geometry on Spatial and Spectral Resolution in a CdZnTe Imaging Array," Nucl. Sci. Symp. and Med. Imag. Conf. 1995 IEEE Conf. Record, Vol. 1 (1996), pp 544–548.

According to one aspect of the present invention, a dramatic improvement over the results obtained by optimizing the pixel size can be further obtained by utilizing not only the signal from a single pixel, designated as the central pixel by some means, but also signals from surrounding pixels to perform the step of estimating the energy and location of interaction events. See D. G. Marks et al., "A 48×48 CdZnTe Array with Multiplexer Readout," IEEE Trans. Nucl. Sc., Vol. 43, No. 3 (1996), pp. 1253–1259, hereby incorporated by reference. In the preferred method of implementing this concept of the invention, the central pixel in a cluster of pixels with above-threshold signals is designated by calculating the centroid of the signals in the cluster. As would be clear to one skilled in the art, simply adding together the signals from several adjacent pixels would be equivalent to using one larger pixel and hole trapping effects would not be eliminated. Therefore, pursuant to one embodiment of the invention, the signal collected in each pixel is compared to a predetermined threshold level, thereby eliminating the small hole contribution, and all signals in a neighborhood of pixels surrounding clusters of adjacent pixels producing above-threshold signals are used, such as by summation, to get an improved estimate of the energy of the gamma ray corresponding to the central pixel. By elimination of signals below the threshold, this approach produces an energy estimate that is a nonlinear function of the data values. Note that the same concept can be implemented using below-threshold signals (including negative signals) from a predetermined neighborhood of adjacent pixels intersecting, including, or contained in the cluster.

We performed gamma-ray imaging and energy resolution tests of a 48×48 CdZnTe detector array following this approach. CdZnTe is a good semiconductor for SPECT imaging because it has high gamma-ray stopping power and is capable of operation at room temperature. Like other room-temperature semiconductors, it has significant charge-carrier trapping, which reduces photopeak efficiency, but the trapping effects are greatly reduced if pixel size is small with respect to detector thickness and the pixel electrode is positively biased, as outlined above.

Figure 3:
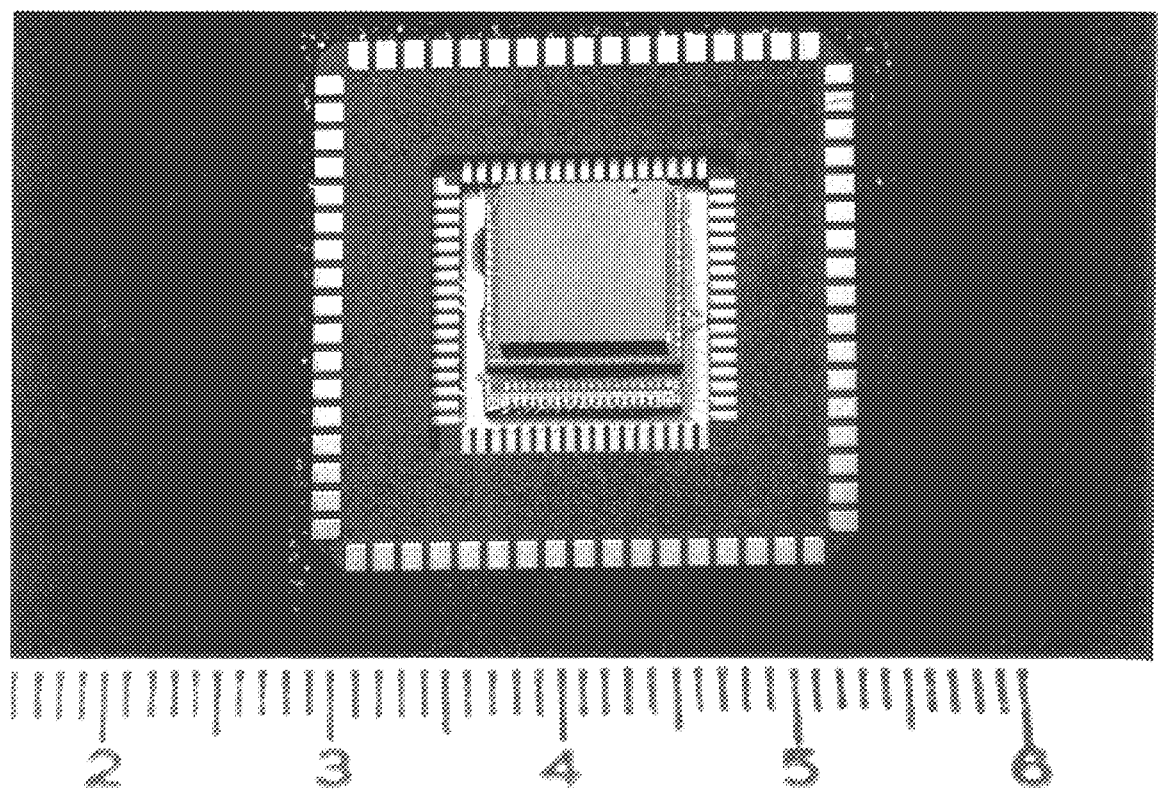
FIG. 3 is a top view of a 48×48 CdZnTe detector module used to implement the procedure of the invention.

The detector module used to practice the invention is shown in FIG. 3. The detector array consisted of a 0.15 cm thick slab of $Cd_{0.8}Zn_{0.2}Te$ incorporating a 48×48 array of 125 $\mu$m square-pixel electrodes on one side produced by photolithography. The other side had a continuous electrode biased at −200 V. Measurements of a test piece of the semiconductor material showed $\mu_e \tau_e \sim 2.3 \times 10^{-3}$ cm$^2$/V and $\mu_h \tau_h \sim 1.8 \times 10^{-5}$ cm$^2$/V, where $\mu_e$ and $\mu_h$ are the electron and hole mobilities and $\tau_e$ and $\tau_h$ are the electron and hole trapping times, respectively. Electrical connections between the detector array and the readout multiplexer (MUX) chip were made by cold welding of indium bumps on the mating surfaces, one indium-bump bond per pixel. The MUX unit cell was the same size as the pixel of the CdZnTe detector, 125 $\mu$m. The detector array assembly was mounted in a 68-pin leadless chip carrier.

Figure 4:
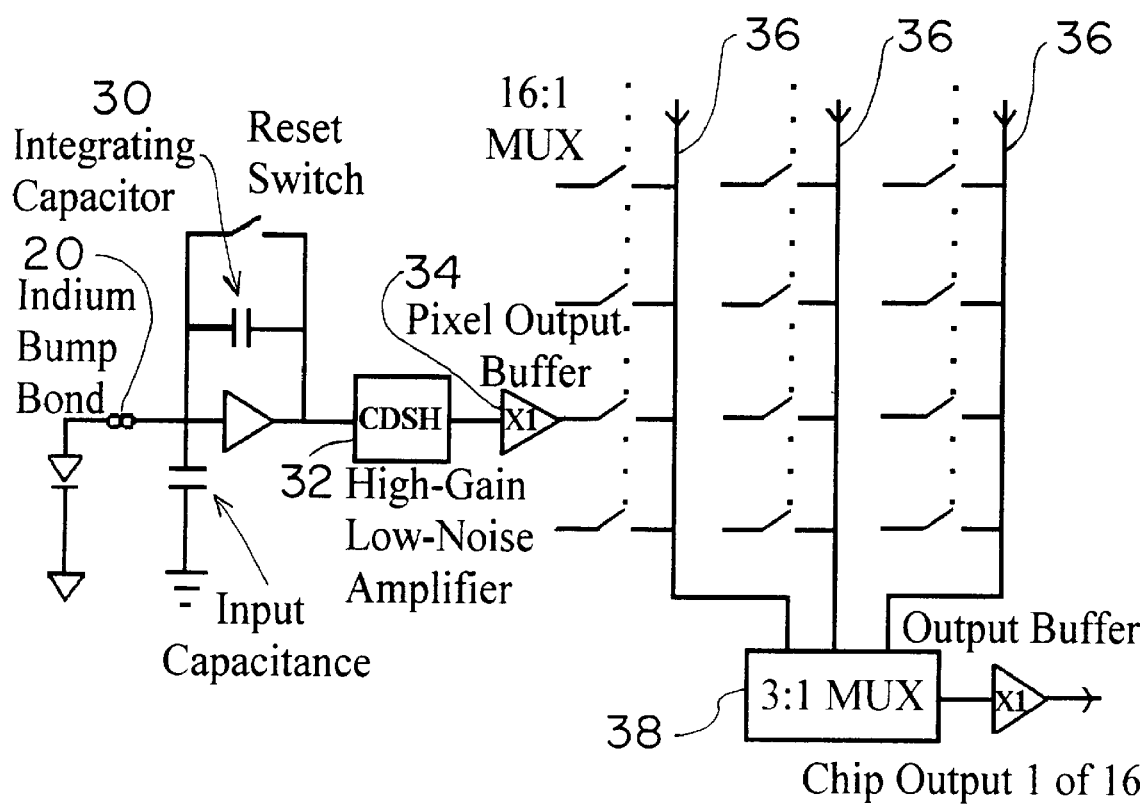
FIG. 4 is a simplified schematic of a multiplexer circuit used with the detector module of FIG. 3.

A simplified schematic of the multiplexer used is shown in FIG. 4. Charge generated in the detector material and recorded at each pixel was stored on an integrating capacitor 30 in a capacitive-feedback transimpedance amplifier, or CTIA circuit. All pixels integrated simultaneously. A correlated double-sample-and-hold (CDSH) circuit 32 was used to eliminate kTC noise; that is, noise caused by resetting the integrating capacitor. Following the CDSH, each pixel contained a unity-gain buffer 34 that was connected to a column bus 36 connecting the outputs of all 48 column pixels. Accordingly, there were 48 column buses. A shift register controlled by an external clocking signal selected which row was connected to the column bus. A 3:1 column multiplexer 38 converted the 48 column output lines to 16 output lines. The MUX was originally designed for reading out these output lines in parallel for faster readout, but this feature was not exploited in testing the present invention. Instead, the output lines were read out serially using a 16:1 external multiplexer.

The concept of the invention was tested at the Optical Detection Laboratories of the University of Arizona utilizing an Interface Technology RS-432 pattern generator to provide clocking signals to the MUX. The MUX output could be read by two different data-acquisition systems. The first system was a simultaneous data storage system; that is, it could store simultaneous pixel signals so that the charge distribution from individual gamma-ray interactions could be observed. Data acquisition was performed through a Tustin analog-to-digital converter (ADC) controlled by a personal computer. The computer checked each pixel signal in a portion of the array and stored that signal if it was above a predetermined threshold. In addition, it stored sub-threshold signals from a predetermined number of pixels adjacent to each pixel having a signal greater than the threshold ("above-threshold pixel").

The thresholding operation, an important and novel component of the invention, ensures that only pixels with actual gamma-ray interactions will be identified as central pixels. Thus, for the purposes of this disclosure the term central pixel is intended to refer both to isolated above-threshold pixels and to a selected pixel, such as the centroid, in each cluster of adjacent above-threshold pixels. As would be clearly understood by those skilled in the art, the selected thresholds vary across the array because each pixel has a different offset voltage. Moreover, offset voltages may vary in time as a function of temperature. Therefore, an offset lookup table was used during processing and recalibrated periodically (e.g., every five minutes) to account for temperature changes in the system, which generally was found to stabilize after about an hour of operation. Gains also vary across the array; therefore, gain values were also stored in a lookup table for correcting signals. The same set of measured gains was used for all data taken in the same portion of the array. It is noted that gains cannot be measured very accurately from single-pixel spectra because of charge spreading to adjacent pixels. Therefore, to get better gain estimates for improved energy resolution, gains were calibrated with an algorithm that takes into account simultaneous signals in adjacent pixels. A listing of the algorithm written in Basic language is reported in FIG. 13.

The second data-acquisition system used in our tests was a VME system that performed pixel-by-pixel energy histogramming and full-frame imaging. Since knowledge of coincident pixel signals is lost when data are stored in the form of histograms, charge distributions from individual gamma-ray interactions cannot be analyzed. This system included software for finding offsets and locating photopeaks in the energy histograms. From these values, energy thresholds could be set for forming images. A gamma-ray was counted into the image only if it produced a pixel signal above the threshold.

We found that a high energy threshold reduces the effects of Compton scattering, but also yields fewer counts in the image because most high-energy gamma rays share charge between several pixels. Also, we found that the histogramming system is faster than the Tustin system that keeps track of simultaneous signals in adjacent pixels.

Pulse-height spectra were generated using Tc-99m, Am-241, Co-57, I-125, and Xe-133 for analyzing energy resolution and linearity. Tc-99m and Am-241 were used to analyze the disclosed methods of improving energy resolution that take into account coincident signals in neighboring pixels. A narrow, collimated Tc-99m beam was used to analyze charge spreading in detail. This beam was formed by a 37 mCi, 0.75 mm diameter source located 40 cm from a 75 $\mu$m pinhole, which was located 2 cm from the detector.

Figure 5:
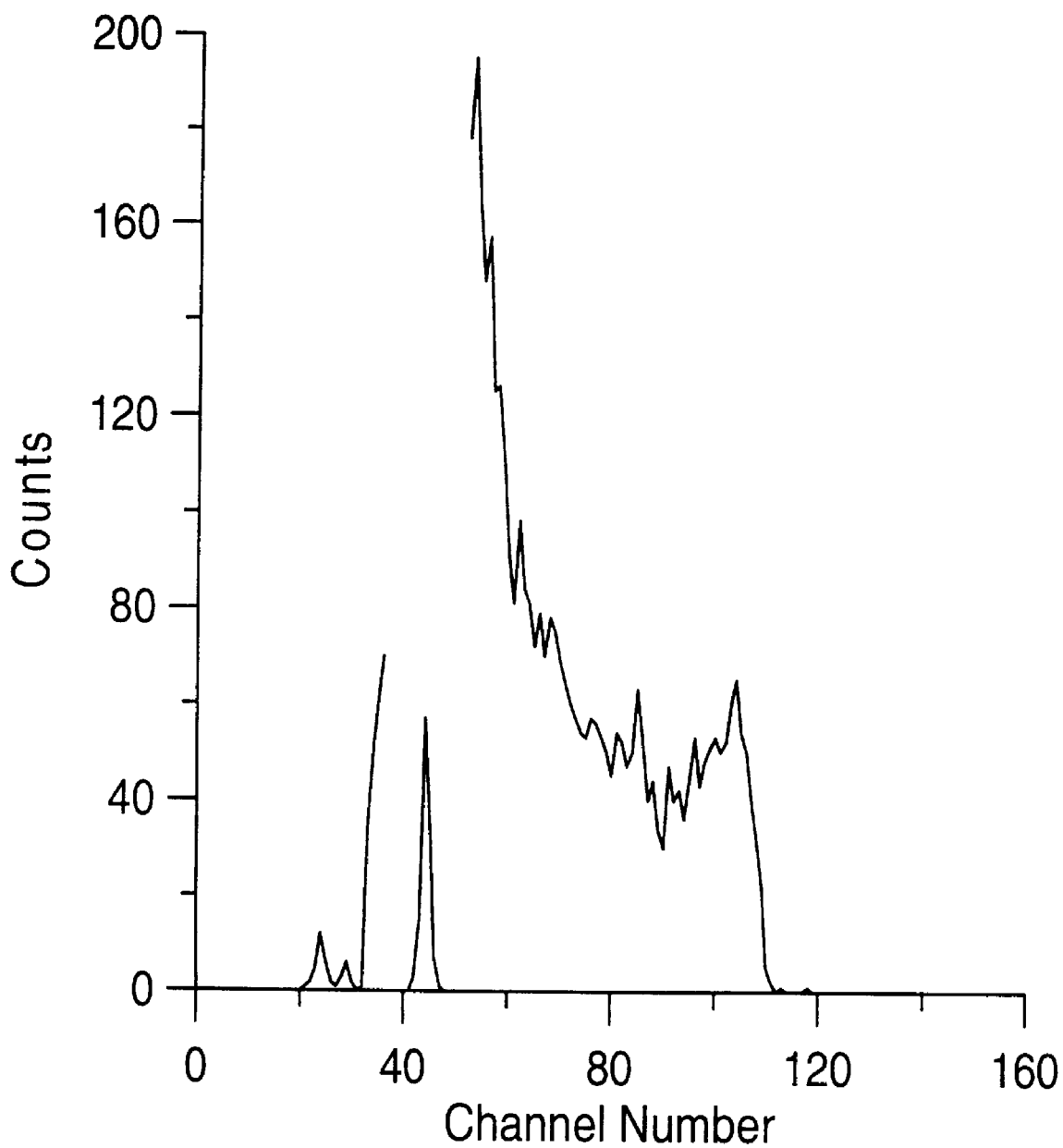
FIG. 5 is a histogram of 159,000 samples taken with a Tc-99m (140 keV) source for 0.5 millisecond integration time.

A single-pixel energy histogram of 159,000 samples taken with a Tc-99m (140 keV) source for 0.5 ms integration time, formed using the VME histogramming system, is shown in FIG. 5. It is noted that the events below the photopeak are due to charge spreading to adjacent pixels from the short-range effects of photoelectron range and charge diffusion, as well as from the longer-range effects of K x-ray escape and Compton scattering. The width of the no-gamma peak, the peak formed by the samples having no gamma-ray interactions, is a measure of the system noise. Here the width corresponds to 7 keV energy resolution. The noise is due to leakage current shot noise and readout noise. The Tustin system, which has far less readout noise, was used to measure the noise in 24 good pixels. It showed an average noise of 194±6 e rms. Leakage current noise was expected to be small (~65 e rms) for the 0.5 millisecond integration time and −200 V bias used, so readout noise would dominate.

Figure 6:
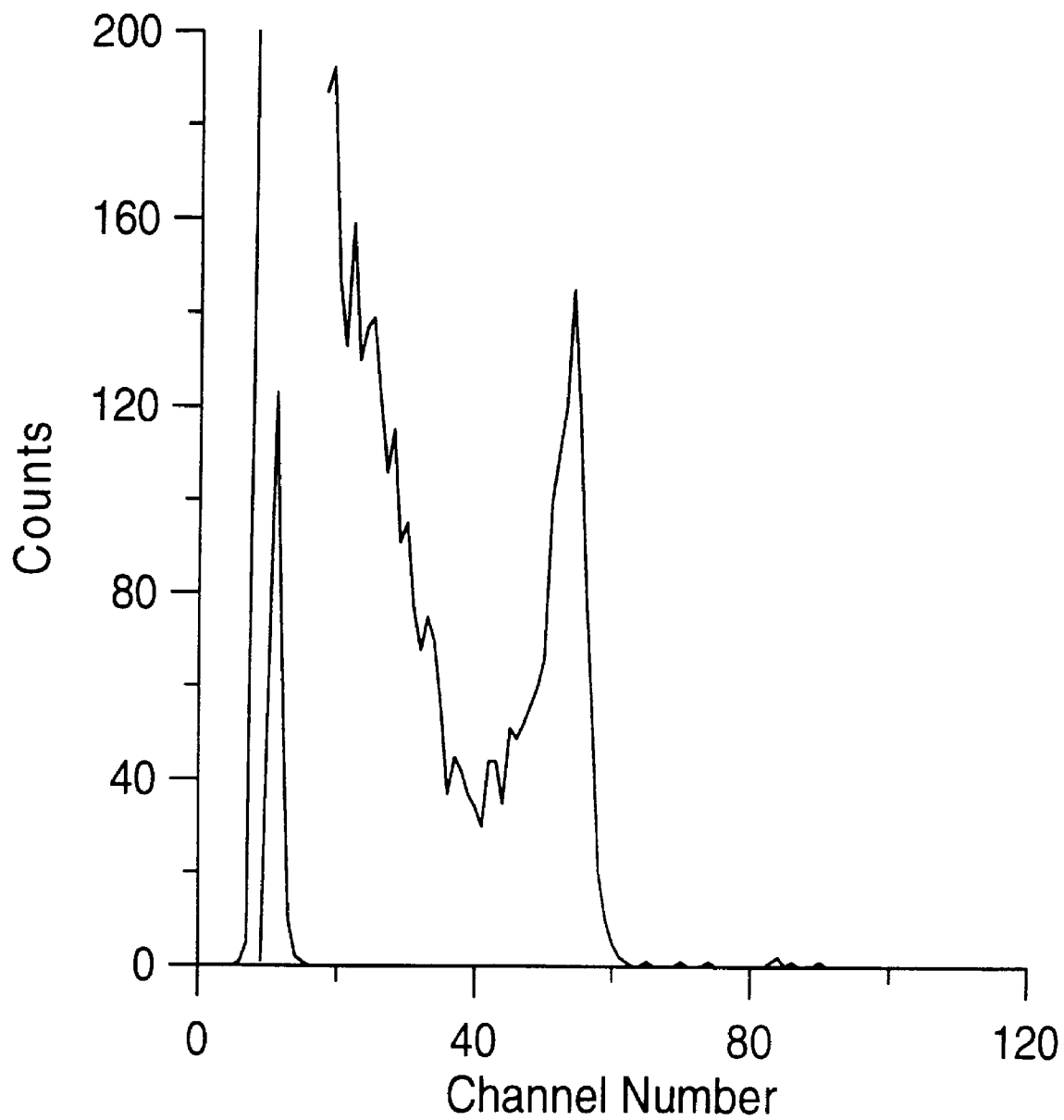
FIG. 6 is a histogram taken with an Am-241 (60 keV) source for 0.5 millisecond integration time, with events excluded that produce charge in adjacent pixel.

Two approaches could be used to improve photopeak resolution, each of which has tradeoffs in counting efficiency, speed, and resolution. The first is to exclude events that produce charge in more than one pixel. This method produces a large reduction in the counting efficiency because for a small pixel size most gamma-ray interactions produce charge in more than one pixel; therefore, this approach is not desirable. A histogram taken with an Am-241 (60 keV) source for 0.5 ms integration time according to this method is shown in FIG. 6 for illustration. It is noted that the no-gamma peak is displayed at ×1,000 reduction at channel 10, and the 60 keV photopeak has 8 keV FWHM energy resolution.

A second method of correcting for charge spreading is to sum coincident signals from nearby pixels according to the first aspect of the invention. (Note that the important criterion here is the utilization of signals from pixels other than the central pixel, summation being only one way of weighing each pixel's contribution. Other methods, such as iterative procedures to produce an improved estimate of the signal, would be equivalently appropriate and possibly better, as one skilled in the art would recognize, depending on the particular application.) Adjacent pixel signals are thus added to the sum if they occur in the same frame and lie above a certain threshold. Alternatively, sub-threshold signals from a number of pixels adjacent to above-threshold pixels may also be added to account for induced-charge effects. The use of thresholds limits the number of pixels that are included in the sum, which is important when summing signals because the total summed noise increases as more pixels are added. As discussed above, trapping effects are minimal for individual 125 $\mu$m pixels in this configuration due to the small-pixel effect (See Barrett et al., supra). Since a 140 keV gamma ray generally produces a signal above the threshold in fewer than four pixels, the total effect of trapping should still be small when using this summing method. As expected, summing only nearest-neighbor pixels (short-range) allows relatively rapid calculation and corrects for the short-range charge spreading. Summing over a large area (long-range) makes it possible to collect nearly all the charge from long-range scattering effects such as K x-ray escape and Compton scattering, improving the counting efficiency.

Figure 7:
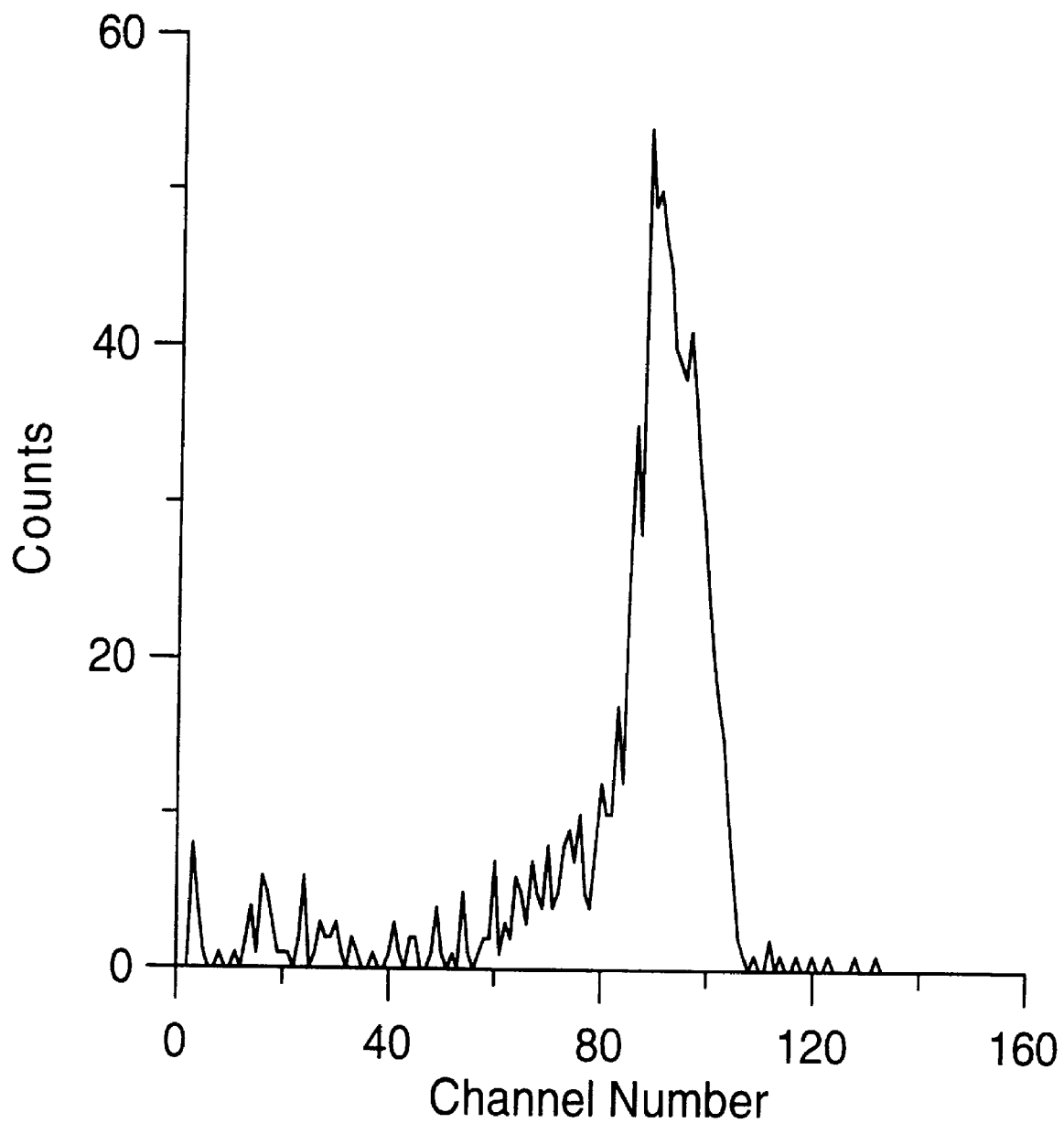
FIG. 7 is a histogram of signals above a 3.5 keV threshold summed in a 3×3 pixel portion of the array with Tc-99m (140 keV) with the requirement that there be at least some charge in the center pixel.
Figure 8:
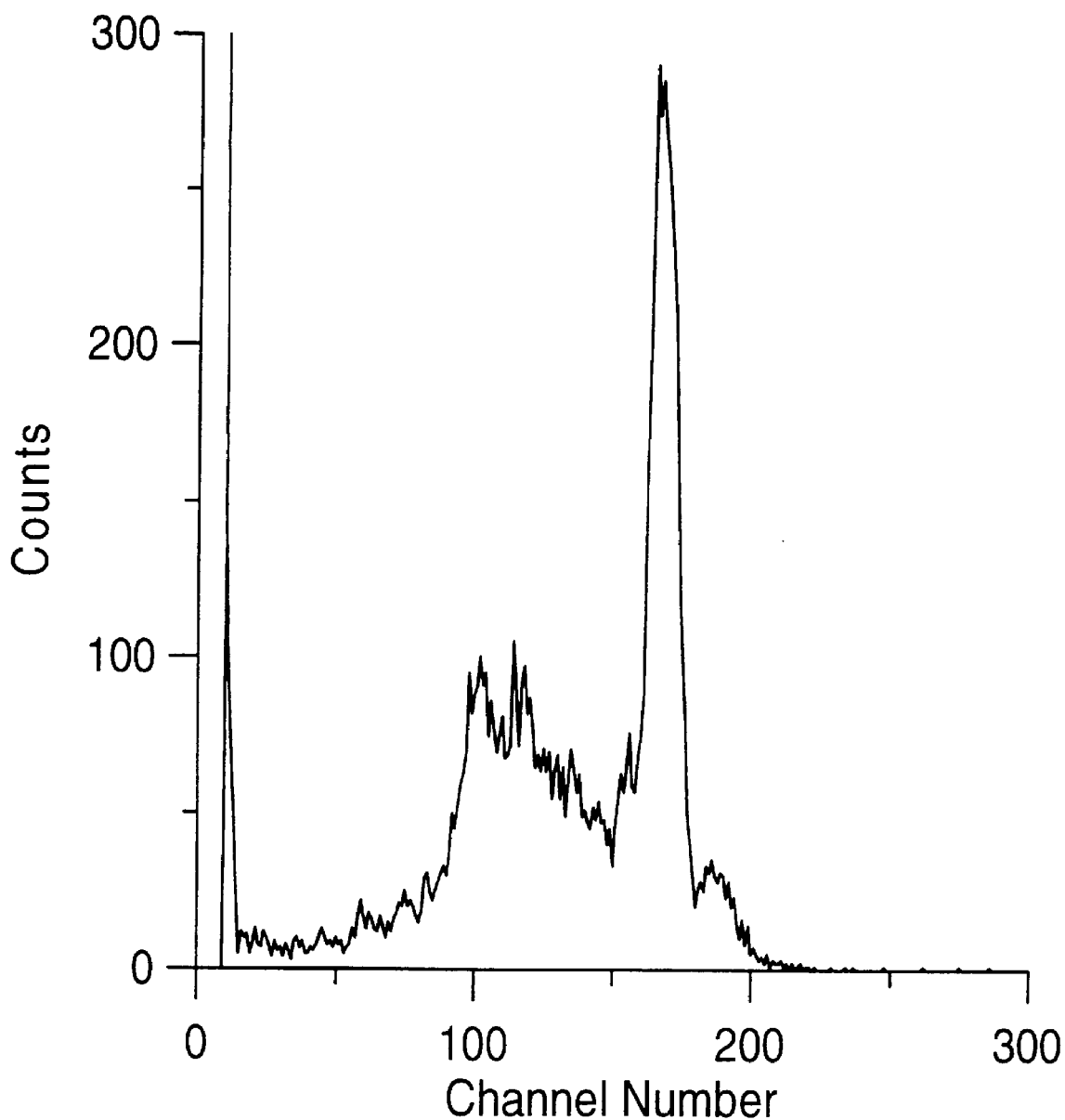
FIG. 8 is a histogram of signals above a 3.5 keV threshold summed in a 3×3 pixel portion of the array with Co-57 (122 keV) with the requirement that there be at least some charge in the center pixel.

Pulse-height spectra using the short-range summing approach are shown in FIGS. 7 and 8. Pixel signals above a 3.5 keV threshold were summed in a 3×3 pixel area using Tc-99m (140 keV) and Co-57 (122 keV, 136 keV) sources, with 0.5 ms integration time, to produce the histograms of the two figures, respectively. The energy resolution for the Tc-99m 140 keV peak is 15 keV FWHM and the resolution for the Co-57 122 keV peak is 11 keV FWHM. The large shoulder below the photopeak in the Cobalt spectrum is due to Compton scattering in the source. The requirement was made that there be at least some charge in the center pixel in order to reduce the effects of gamma rays which hit on the edge of the 3×3 array. This requirement lead to the rejection of a large number of events and thus to a reduced counting efficiency in this arrangement, but it could be satisfied in an imaging system without a reduction in counting efficiency by always choosing summing areas centered on pixels with signals above the threshold.

Figure 9:
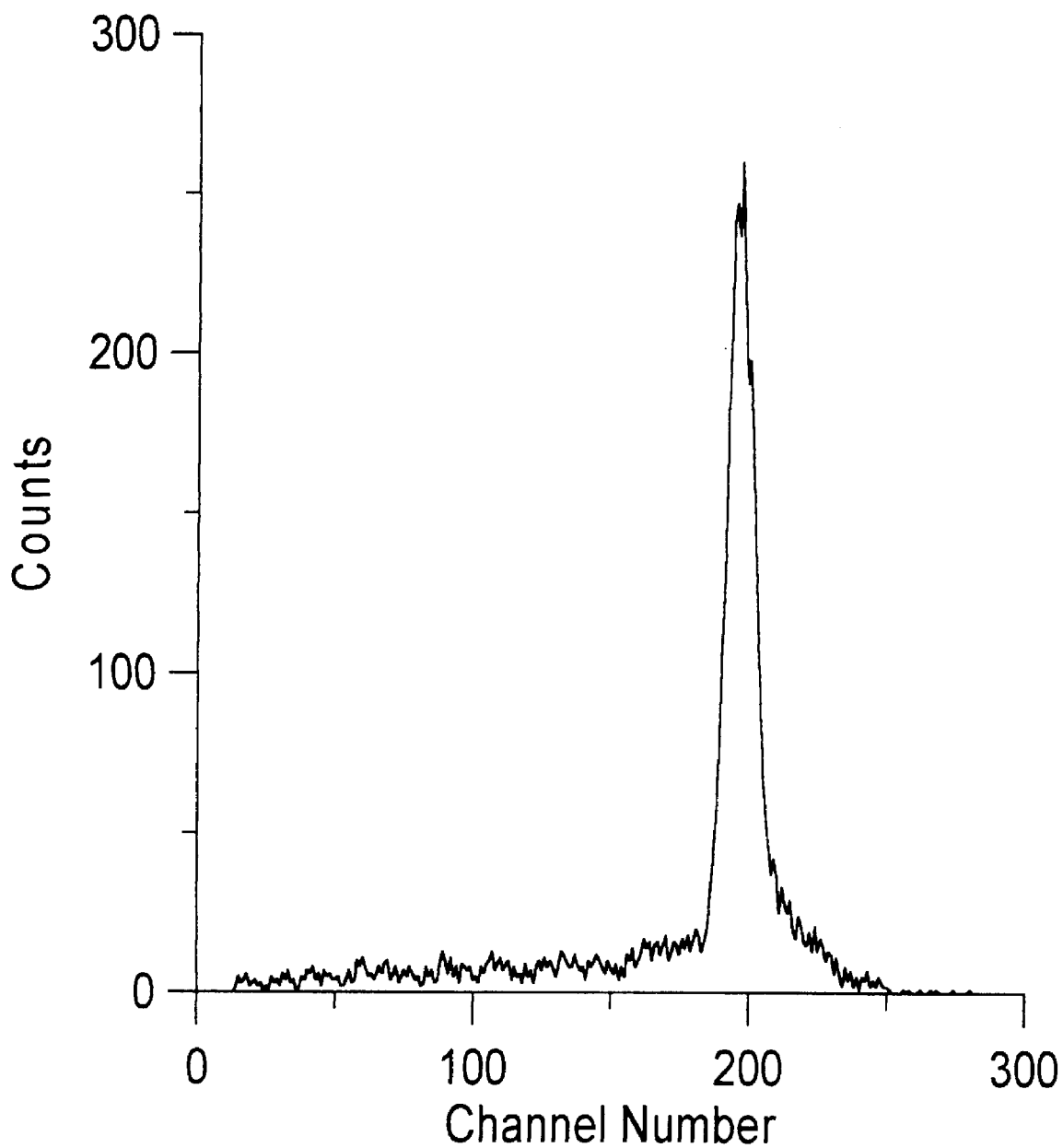
FIG. 9 is a histogram of signals above a 3.5 keV threshold summed in a 15×16 pixel array with a Tc-99m (140 keV) source with 0.5 millisecond integration time.

A spectrum obtained using the long-range summing approach is shown in FIG. 9. Pixel signals above a 3.5 keV threshold were summed in a 15×16 pixel portion of the array. The larger amount of data analysis makes this a slower signal correction method. The spectrum was obtained using the collimated Tc-99m (140 keV) beam with 120 $\mu$m width centered on a central pixel in the 15×16 array and 0.5 ms integration time. The energy resolution for this spectrum was 10 keV FWHM and 80% of the events occurred within ±14 keV of the photopeak. The greatly reduced background was mostly due to the lack of gamma-ray hits at the border of the summing area. Raising the energy threshold would speed up data analysis by reducing the amount of data, but energy resolution would degrade since more real charge would be lost.

Figure 10:
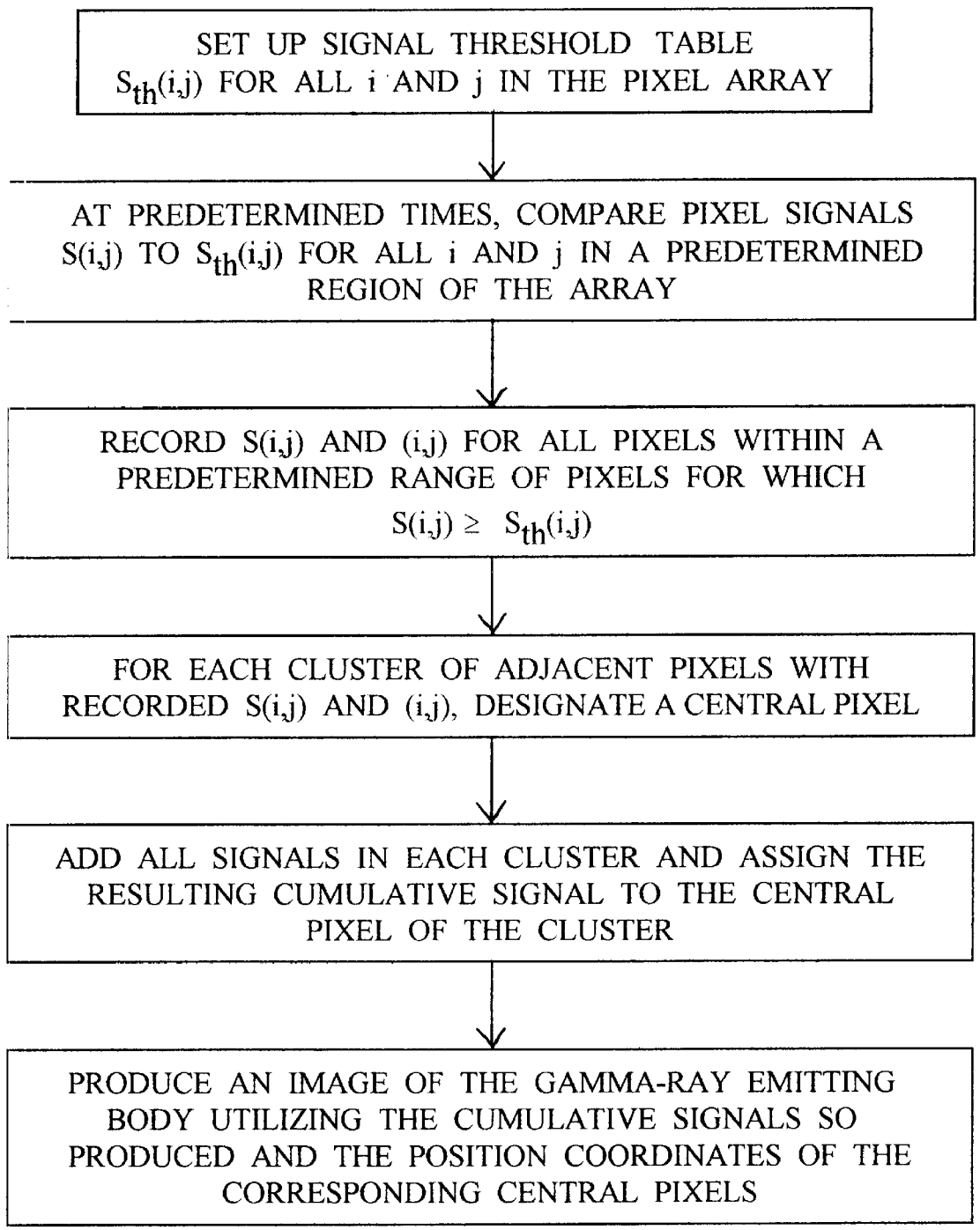
FIG. 10 is a flow chart of the procedure of the invention illustrating the concept of utilizing thresholded detector signals to improve the estimates of the spatial coordinates and energy of gamma-ray interaction events in a semiconductor detector.

These tests demonstrated the improvement that can be attained by utilizing thresholded signals from a plurality of adjacent pixels. Thus, as illustrated in the block diagram of FIG. 10, the first aspect of the method of the invention consists of establishing a signal threshold table [$S_{th}(i,j)$, for all i and j in the pixel array], which is updated periodically to account for system instability. At predetermined time intervals (or each time a gamma-ray interaction event occurs), clusters of adjacent pixels registering signals greater than the corresponding threshold levels are identified and one of the pixels in the cluster is designated as the central pixel according to a predetermined strategy (for example, by selecting the pixel with maximum signal). Then all signals from pixels in a neighborhood including at least a portion of the cluster are summed to produce a cumulative signal that is assigned to the central pixel for imaging purposes.

According to another aspect of the present invention, a technique labeled by the inventors as "list-mode estimation" was used to improve the process of event estimation. The term "list-mode" has been used for years in nuclear medicine to describe a kind of data storage where multiple attributes of each gamma-ray event are simply stored in a list. In traditional applications, the attributes of interest have been the x and y coordinates of the gamma-ray interaction, the energy of the gamma ray, and sometime its time of arrival. For the purposes of the present invention, the term is defined more broadly to include any parameter that is measured for each event. In the context of semiconductor detector arrays, the list might include the signal in the central pixel and some set of its neighbors. In addition, it could include signals from the continuous electrode on the side of the slab away from the pixel array. Note that this electrode could also be segmented into distinct regions like large pixels. In the extreme case, there could be pixel arrays on both sides of the slab, and signals from all electrodes could comprise the list.

From knowledge of the basic physics of gamma-ray interactions and charge transport, along with mathematical models developed for these processes, it is possible to predict the probability laws for the random signals in the list if we assume that the parameters (x, y, z, E) are known. Of course, the parameters art not known, but, by maximizing the likelihood function of the recorded data (based on their probability distribution) with respect to the desired parameters, a maximum-likelihood (ML) estimate of the parameters can be obtained.

As one skilled in the art understands, with some prior knowledge of the parameters the ML estimate can be further improved by using Bayesian methods. For example, for depth of interaction, it is known a priori that the gamma rays are most likely to be absorbed at the entrance face of the slab and that the prior probability density on z decays exponentially with z at a known rate. Similarly, in many applications there is some prior knowledge of the expected energy spectrum, and that knowledge can also be built into the estimate.

Figure 2:
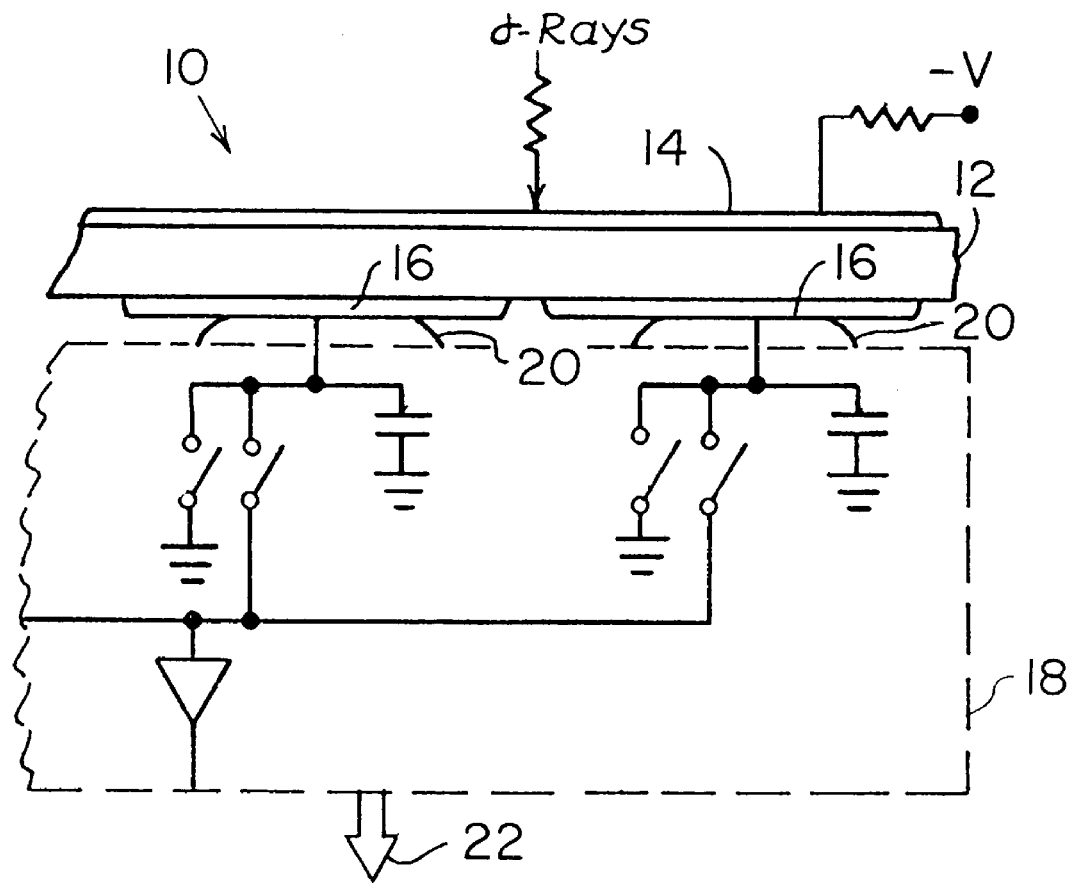
FIG. 2 is an enlarged partial representation illustrating readout circuitry in the output slab of the detector of FIG. 1.

In order to estimate x, y, z and E for individual gamma-ray interactions in a semiconductor pixel detector, a large sample of interactions must be available that have known x, y, z and E and measured or calculated signals $\{S_{i,j}\}$. In practice, a combination of experimental measurement and modelling calculations are used to produce the required data set. A knowledge of the mechanisms of charge transport in semiconductor detectors and how the signal is produced on pixel electrodes is critical for this task; a clear understanding of these mechanisms has only recently become available (see Barrett et al., supra; Eskin et al., "The Effect of Pixel Geometry on Spatial and Spectral Resolution in a CdZnTe Imaging Array," supra; and Eskin et al., "Variations in Pulse-Height Spectrum and Pulse Timing in CdZnTe Pixel Array Detectors," supra. In order to understand how a signal is generated on pixel electrodes, it is instructive to consider two limiting cases, completed charge transport and uncompleted charge transport. Examples of completed charge transport are the production of an electron-hole pair at the top negative electrode (element 14 in FIG. 2) with the electron travelling across the detector slab 12 to a pixel electrode 16 or the production of an electron-hole pair in the bulk of the detector with the electron transported to a pixel electrode and the hole transported to the top electrode. For completed transport, the entire signal for that charge carrier appears on the pixel electrode at which the electron arrives, and there is no signal on adjacent electrodes. However, it should be clear that for each charge carrier in transit, a potential is definable at every pixel electrode; therefore, transient signals are present on all electrodes.

Specifically with reference to the pixel circuit of FIG. 4, the pixel electrode is kept at ground potential by the amplifier so that charge must flow into or out of the amplifier and a corresponding charge must appear on the integrating capacitor 30 (the signal) as a charge carrier moves across the detector (see Eskin et al., "The Effect of Pixel Geometry on Spatial and Spectral Resolution in a CdZnTe Imaging Array," supra). For completed charge transport, all the signal appears on the pixel electrode at which the electron arrives; the transient signal that first appears on adjacent electrodes is entirely subtracted away during the completion of transport. Thus, there is no signal on adjacent electrodes.

When charge transport is not completed, due, for example, to hole trapping in the bulk of the detector, there is some residual signal left on each pixel electrode, which is referred to as "net-induced" signal. When there is trapping, there are net-induced signals on all adjacent electrodes even if charge carriers do not arrive at these electrodes. In general, the net-induced signals are small and for hole trapping they are often negative, i.e., in the opposite sense as signals due to completed transport. It should be noted that there is no ambiguity about this description because energy conservation is maintained when all signals together with the potential energy of the residual space charge (trapped carriers) are taken into account. The essential features of this explanation have been verified experimentally (see Eskin et al., "Variations in Pulse-Height Spectrum and Pulse Timing in CdZnTe Pixel Array Detectors," supra).

Thus, it is now accepted that the most general result of a gamma-ray interaction in a semiconductor pixel detector would be energy and charge carrier production distributed over a number of pixel volumes due to Compton scattering, K x-rays, charge diffusion and the finite range of the photoelectron. Completed charge transport would then give rise to strong signals in some pixels but trapping would result in net-induced signals (mostly negative) in all pixels but most prominently in those adjacent to the point of interaction.

Simple thresholding with pixel summing will account for the completed transport signal (for small pixels and electron dominance, this is most of the signal) but it will not properly deal with the net-induced signals. Because the trapping effects dominate the net-induced signal, pixels having only this type of signal should be the most useful for estimating depth of interaction. Clearly, the optimal way to determine x, y, z and E is to properly model both types of signal and to make use of as many pixel signals as possible within noise constraints.

Figure 11:
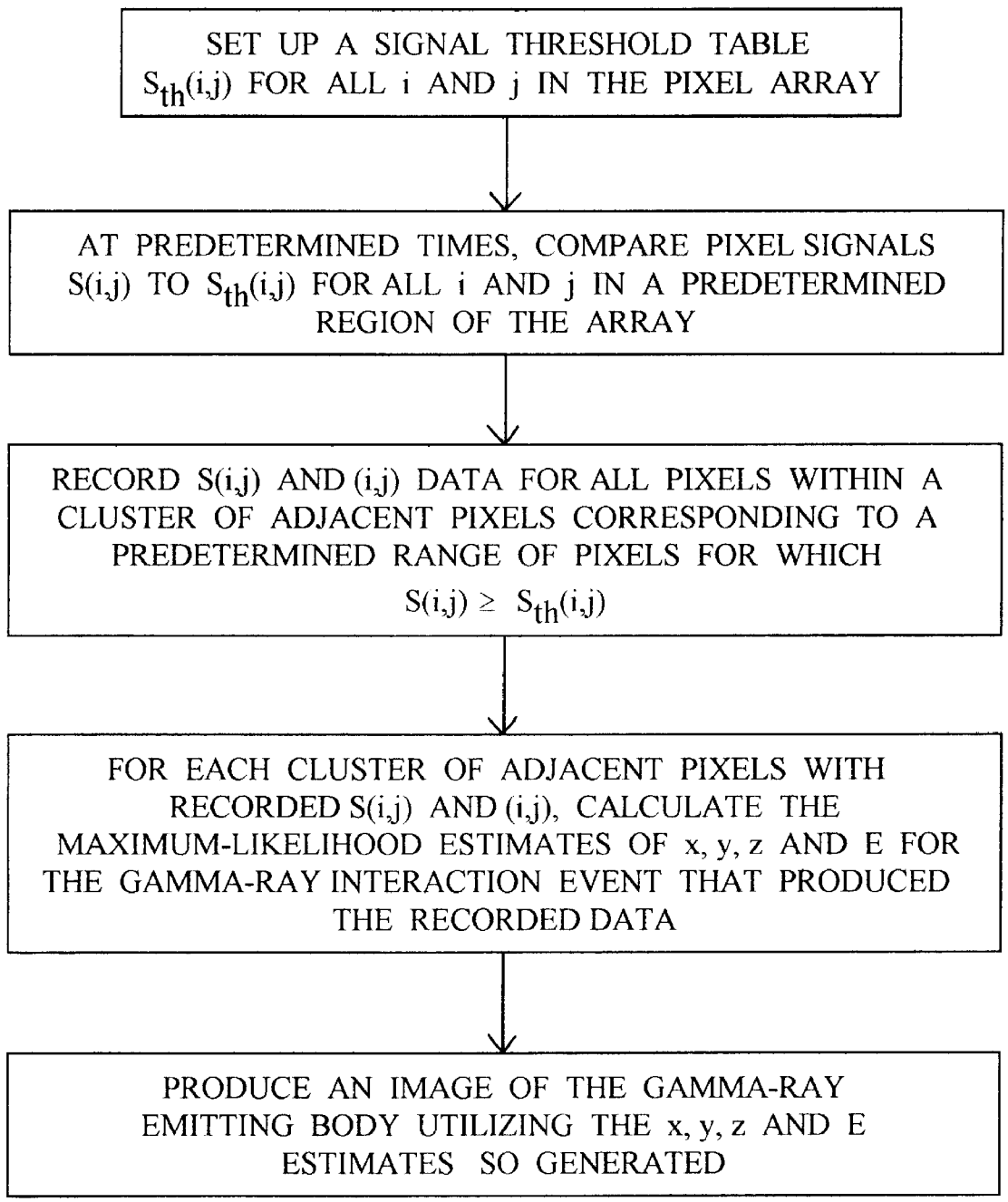
FIG. 11 is a flow chart of another procedure of the invention illustrating the concept of utilizing thresholded detector signals to calculate maximum-likelihood estimates of the spatial coordinates and energy of gamma-ray interaction events in a semiconductor detector.
Figure 12:
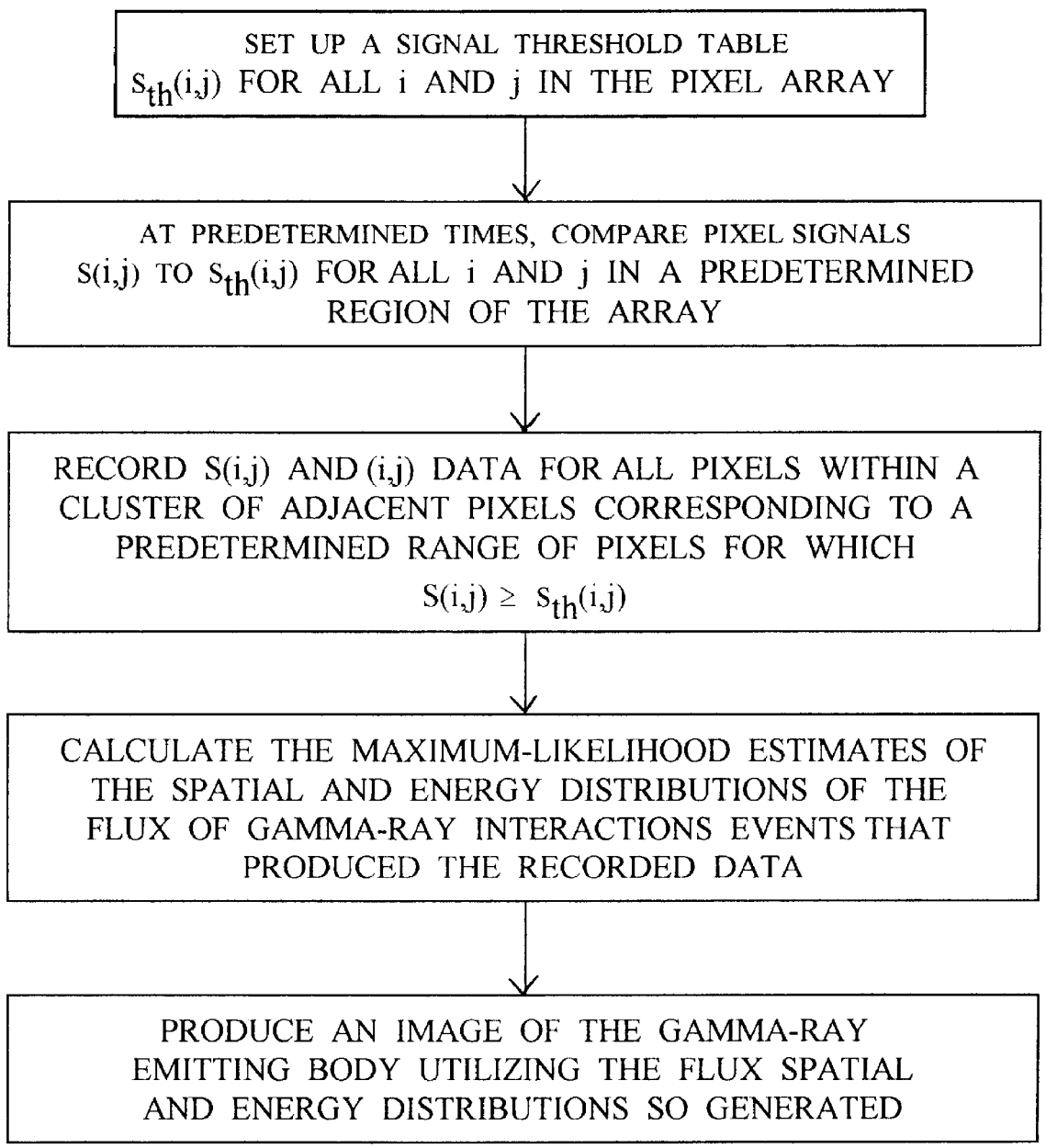
FIG. 12 is a flow chart of yet another procedure of the invention illustrating the concept of utilizing thresholded detector signals to calculate maximum-likelihood estimates of the spatial and energy distribution of the fluence of gamma-ray interaction events in a semiconductor detector.

It has been demonstrated that ML estimation techniques can be used to improve the energy spectrum of a single-element detector if accurate knowledge of the likelihood function is available (see Eskin et al., "Recovery of Spectral Information from an Imperfect Detector Using the Expectation Maximization Algorithm," Nuclear Sci. Symp. and Med. Imag. Conf. 1994 IEEE Conf. Record. Vol. 1 (1995), pp. 150–154; Wang, Xiaohan and Kenneth Koral, "A regularized Deconvolution-Fitting Method for Compton-Scatter Correction in SPECT," IEEE Trans. on Med. Imag., Vol. 11, No. 3 (1992), pp. 351–360; and U.S. Pat. No. 5,315,506 to Wang et al.). Thus, according to other aspects of this invention, this idea can be extended to estimation of x, y, z and E for single-event interactions and to estimation of the fluence Φ of gamma rays as a function of x, y (and possibly z) and/or E. The procedures are illustrated in the flow diagrams of FIGS. 11 and 12, respectively. The key requirement in all cases is accurate knowledge of the appropriate likelihood function $P(\{S_{k,l}\}|x,y,z,E)$ for a signal $S_{k,l}$ produced by the $l^{th}$ gamma-ray event in the kth pixel assuming the parameters x, y, z and E. Based on this function, maximum-likelihood estimates x, y, z, and E can be obtained through maximization of the likelihood function according to known ML estimation procedures.

It is standard practice to test gamma-ray detectors with collimated beams of various kinds of radiation, including alpha particles as well as gamma rays. This approach can be extended by carefully mapping the properties of the detector on a neighborhood basis, as opposed to single-pixel properties. That is, when an event occurs, not only its response in the irradiated pixel is recorded but in neighboring pixels as well. Each pixel in turn is irradiated by stepping the collimated source over the array with a mechanical stage.

The overall objective of this procedure is to establish a histogram that approximates the likelihood of the list-mode data as a function of position and energy of the gamma rays. To achieve this objective spatial maps of carrier transport properties (mobility and lifetime of holes and electrons), of leakage current, and of gain and offset of the readout circuit are made. These data are then used to derive the likelihood function and perform ML estimation of x, y, z and E from list-mode data.

Essential to this calibration procedure is a sophisticated data-collection system that allows the recording of a spectrum at each pixel as well as conditional spectra (that is, histograms of signals in one pixel given that an event above a certain threshold has occurred in a specified neighboring pixel). For cost reasons, it would not be practical to duplicate this data collection system for every device in a complex imaging system consisting of perhaps hundreds of detector arrays. Thus, it is anticipated that at least some of the functions of this system will be incorporated on the readout chip, making a "very smart" readout. A key difference between this readout and present smart readouts is that substantial on-chip memory would be required with the very smart device. For gamma-ray applications, this is feasible because the arrays have to be quite large (current ones are 2.5×2.5 cm), and there is much unused silicon space.

The present invention has shown the benefits of processing together signals from a central pixel and its neighbors, but the design of current readout hardware is not well suited to take advantage of this approach. With the current frame period of 0.5–1 msec, there is a significant chance that multiple events can contribute signals to a neighborhood before the next readout scan. If this happens, information from both events is degraded or lost. Therefore, it is anticipated that the solution to this problem lies in the use of a modified sparse readout in which not only the central pixel but also its neighbor pixels are read out as soon as an event occurs. At the same time, a signal from the opposite electrode can also be extracted to assist in depth estimation.

Once a basic geometry has been chosen for a detector array, there are many parameters to be optimized, including number and size of pixel, thickness of the crystal and the applied electric field. In addition, there are tradeoffs in the choice of detector material; key material parameters include resistivity, electron and hole mobilities and lifetimes, atomic number and density. Estimation theory provides a way of optimally choosing these device parameters and optimizing the performance of the detector array. From the likelihood function, it is possible to compute the Fisher information matrix (a 4×4 matrix when there are 4 parameters), and from this matrix the covariance matrix of the parameter estimates can be found. This information can be used, in turn, to optimize the design of the detector array and readout.

The work that led to the present invention has considered square arrays of square pixels, but many different pixel shapes and array geometries can be used. In particular, a crossed-stripe geometry can be used where the electrodes on one side of the detector slab are stripes parallel to the x axis and those on the other side are stripes parallel to the y axis. This configuration can be used in order the reduce the complexity of external electronics because 2N amplifier chains rather than $N^2$ are needed to read out an N×N image. The x and y coordinates of the gamma ray can be simply estimated by the coordinates of the stripes on each side that give the largest signal, but the concepts of list-mode ML estimation and system calibration disclosed herein are applicable to this application as well. Other kinds of detector arrays are also amenable to the signal-processing techniques described here. In particular, these methods can be used with electron-beam readout, multiple-wire proportional chambers, and arrays of discrete, mechanically separated detectors.

While the invention is described herein preferentially in terms of zinc-cadmium-telluride, any semiconductor material suitable for radiation detection, such as cadmium telluride, mercuric iodide, lead iodide, germanium, or thallium bromide, may be used with appropriate temperature control adjustments, if necessary.

Various other changes in the details, steps and materials that have been described may be made by those skilled in the art within the principles and scope of the invention herein illustrated and defined in the appended claims. Therefore, while the present invention has been shown and described herein in what is believed to be the most practical and preferred embodiments, it is recognized that departures can be made therefrom within the scope of the invention, which is therefore not to be limited to the details disclosed herein but is to be accorded the full scope of the claims so as to embrace any and all equivalent apparatus and methods.

What we claim is:

1. A method of estimating spatial and energy parameters of gamma rays interacting with a semiconductor detector, wherein a slab of semiconductor material is positioned in a field of view of an aperture imaging system to receive gamma rays from a gamma-ray emitting source, said semiconductor material being capable of absorbing incident gamma rays; wherein said slab of semiconductor material is subjected to an electric field between an electrode attached to a side of the slab exposed to radiation and a plurality of electrodes attached to another side of the slab, whereby the slab is partitioned into a corresponding plurality of sensor-cell pixels individually capable of producing an electric current pulse when a gamma ray is absorbed within a pixel; wherein a monolithic multiplexer is coupled to said plurality of electrodes for the read-out of electric pulses generated in each of said pixels as a result of gamma-ray absorption events; and wherein the current-pulse output of each pixel is integrated during each step of operation of said monolithic multiplexer by accumulation in a corresponding capacitor means that is discharged at predetermined times producing a voltage signal through a single-output channel of the multiplexer and that is then reset for charging during a next step of operation; said method comprising the following steps:

(a) comparing said voltage signal for each pixel to a corresponding predetermined threshold signal and identifying all pixels having an above-threshold voltage signal;

(b) identifying clusters of adjacent pixels having above-threshold voltage signals and selecting a pixel within each cluster as a central pixel for the cluster;

(c) summing all voltage signals of adjacent pixels within a predetermined range of said central pixel to produce a cumulative voltage signal for the cluster and assigning said cumulative voltage signal to the central pixel of the cluster; and (d) processing the cumulative voltage signal generated in step (c) for each cluster as an output signal associated with a spatial coordinate of said corresponding central pixel for constructing an image of the gamma-ray emitting source.

2. The method described in claim 1, wherein said predetermined range includes pixels having a voltage signal below said threshold signal.

3. The method described in claim 1, wherein said voltage signal for each pixel is read out at predetermined time intervals.

4. The method described in claim 1, wherein said voltage signal for each pixel is read out each time a gamma-ray interaction event occurs.

5. The method described in claim 1, wherein said electrode attached to a side of the slab of semiconductor material exposed to radiation consists of plurality of electrodes, whereby pixel arrays exist on both sides of the slab.

6. A method of estimating spatial-coordinate and energy parameters of gamma rays interacting with a semiconductor detector for which a probability distribution is known relating spatial and energy parameters of each interaction event, wherein a slab of semiconductor material is positioned in a field of view of an aperture imaging system to receive gamma rays from a gamma-ray emitting source, said semiconductor material being capable of absorbing incident gamma rays; wherein said slab of semiconductor material is subjected to an electric field between an electrode attached to a side of the slab exposed to radiation and a plurality of electrodes attached to another side of the slab, whereby the slab is partitioned into a corresponding plurality of sensor-cell pixels individually capable of producing an electric current pulse when a gamma ray is absorbed within a pixel; wherein a monolithic multiplexer is coupled to said plurality of electrodes for the read-out of electric pulses generated in each of said pixels as a result of gamma-ray absorption events; and wherein the current-pulse output of each pixel is integrated during each step of operation of said monolithic multiplexer by accumulation in a corresponding capacitor means that is discharged at predetermined times producing a voltage signal through a single-output channel of the multiplexer and that is then reset for charging during a next step of operation; said method comprising the following steps:

(a) comparing said voltage signal for each pixel to a corresponding predetermined threshold signal and identifying all pixels having an above-threshold voltage signal;

(b) identifying clusters of adjacent pixels having above-threshold voltage signals; and, for each such cluster, recording the voltage signal and coordinate position of a predetermined number of adjacent pixels within a predetermined range of pixels intersecting said cluster;

(c) utilizing said probability distribution for gamma rays interacting with the semiconductor detector to calculate a maximum-likelihood estimate of a spatial coordinate and an energy level for each gamma-ray interaction event recorded within each cluster; and (d) processing the spatial coordinate and energy level for each recorded gamma-ray interaction event generated in step (c) for each cluster as output signals for constructing an image of the gamma-ray emitting source.

7. The method described in claim 6, wherein said predetermined range includes pixels having a voltage signal below said threshold signal.

8. The method described in claim 6, wherein said voltage signal for each pixel is read out at predetermined time intervals.

9. The method described in claim 6, wherein said voltage signal for each pixel is read out each time a gamma-ray interaction event occurs.

10. The method described in claim 6, wherein said probability distribution consists of a theoretical model with parameters fitted to data obtained from detector measurements.

11. The method described in claim 6, wherein said electrode attached to a side of the slab of semiconductor material exposed to radiation consists of plurality of electrodes, whereby pixel arrays exist on both sides of the slab.

12. A method of estimating a spatial and an energy distribution of a fluence of gamma rays interacting with a semiconductor detector when a probability distribution is known relating spatial and energy parameters of each interaction event, wherein a slab of semiconductor material is positioned in a field of view of an aperture imaging system to receive gamma rays from a gamma-ray emitting source, said semiconductor material being capable of absorbing incident gamma rays; wherein said slab of semiconductor material is subjected to an electric field between an electrode attached to a side of the slab exposed to radiation and a plurality of electrodes attached to another side of the slab, whereby the slab is partitioned into a corresponding plurality of sensor-cell pixels individually capable of producing an electric current pulse when a gamma ray is absorbed within a pixel; wherein a monolithic multiplexer is coupled to said plurality of electrodes for the read-out of electric pulses generated in each of said pixels as a result of gamma-ray absorption events; and wherein the current-pulse output of each pixel is integrated during each step of operation of said monolithic multiplexer by accumulation in a corresponding capacitor means that is discharged at predetermined times producing a voltage signal through a single-output channel of the multiplexer and that is then reset for charging during a next step of operation; said method comprising the following steps:

(a) comparing said voltage signal for each pixel to a corresponding predetermined threshold signal and identifying all pixels having an above-threshold voltage signal;

(b) identifying clusters of adjacent pixels having above-threshold voltage signals and recording the voltage signal and coordinate position of a predetermined number of adjacent pixels within a predetermined range of pixels intersecting said cluster;

(c) utilizing said probability distribution for gamma rays interacting with the semiconductor detector to calculate a maximum-likelihood estimate of a spatial distribution and an energy distribution of a fluence of recorded gamma-ray interaction events; and (d) processing said spatial distribution and energy distribution of a fluence of recorded gamma-ray interaction events generated in step (c) for constructing an image of the gamma-ray emitting source.

13. The method described in claim 12, wherein said predetermined range includes pixels having a voltage signal below said threshold signal.

14. The method described in claim 12, wherein said voltage signal for each pixel is read out at predetermined time intervals.

15. The method described in claim 12, wherein said voltage signal for each pixel is read out each time a gamma-ray interaction event occurs.

16. The method described in claim 12, wherein said probability distribution consists of a theoretical model with parameters fitted to data obtained from detector measurements.

17. The method described in claim 12, wherein said electrode attached to a side of the slab of semiconductor material exposed to radiation consists of plurality of electrodes, whereby pixel arrays exist on both sides of the slab.

* * * * *